(12) United States Patent
Tsubaki et al.

(10) Patent No.: US 10,263,589 B2
(45) Date of Patent: Apr. 16, 2019

(54) NOISE FILTER

(71) Applicant: Mitsubishi Electric Corporation, Tokyo (JP)

(72) Inventors: Yusuke Tsubaki, Tokyo (JP); Mao Kawamura, Tokyo (JP); Mamoru Takikita, Tokyo (JP); Kenji Hirose, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 59 days.

(21) Appl. No.: 14/889,523

(22) PCT Filed: Sep. 17, 2013

(86) PCT No.: PCT/JP2013/075004
§ 371 (c)(1),
(2) Date: Nov. 6, 2015

(87) PCT Pub. No.: WO2015/040665
PCT Pub. Date: Mar. 26, 2015

(65) Prior Publication Data
US 2016/0126919 A1    May 5, 2016

(51) Int. Cl.
*H03H 7/01* (2006.01)
*H01G 4/40* (2006.01)
(Continued)

(52) U.S. Cl.
CPC ............. *H03H 7/0115* (2013.01); *H01G 4/35* (2013.01); *H01G 4/40* (2013.01); *H03H 7/427* (2013.01);
(Continued)

(58) Field of Classification Search
CPC .... H03H 1/00; H03H 2001/0092; H03H 7/01; H03H 7/09; H04B 3/28; H04B 3/30
(Continued)

(56) References Cited

U.S. PATENT DOCUMENTS 6,546,100 B1    4/2003  Drew
2012/0105016 A1    5/2012  Moon et al.

FOREIGN PATENT DOCUMENTS

CN    2466839 Y    12/2001
EP    1 006 673 A1    6/2000
(Continued)

OTHER PUBLICATIONS

Panasonic data sheet for Plastic film capacitors, ECQE series, Apr. 2013.*
(Continued)

*Primary Examiner* — Benny T Lee
*Assistant Examiner* — Hafizur Rahman
(74) *Attorney, Agent, or Firm* — Sughrue Mion, PLLC; Richard C. Turner

(57) ABSTRACT

A noise filter is provided with a filter circuit including a first condenser and a second condenser; the first condenser and the second condenser are connected in parallel with each other by a first wiring lead for connecting one terminal of the first condenser with one terminal of the second condenser and a second wiring lead for connecting the other terminal of the first condenser with the other terminal of the second condenser; the first wiring lead and the second wiring lead are arranged in such a way as to intersect each other odd-number times.

8 Claims, 11 Drawing Sheets

(51) Int. Cl.
- *H03H 7/42* (2006.01)
- *H04B 3/26* (2006.01)
- *H01G 4/35* (2006.01)
- *H03H 1/00* (2006.01)
- *H02M 1/12* (2006.01)
- *H02J 3/01* (2006.01)

(52) U.S. Cl.
CPC .................. *H04B 3/26* (2013.01); *H02J 3/01* (2013.01); *H02M 1/12* (2013.01); *H03H 2001/0035* (2013.01)

(58) Field of Classification Search
USPC .... 333/12, 167, 175, 181, 184; 336/90, 192; 361/275.1
See application file for complete search history.

(56) References Cited

FOREIGN PATENT DOCUMENTS

| | | |
|---|---|---|
| JP | 5-53320 U | 7/1993 |
| JP | 06-77756 A | 3/1994 |
| JP | 07-226331 A | 8/1995 |
| JP | 2000-259048 A | 9/2000 |
| JP | 2000-299615 A | 10/2000 |
| JP | 2000-315930 A | 11/2000 |
| JP | 2001-023849 A | 1/2001 |
| JP | 2002-164245 A | 6/2002 |
| JP | 2007-124125 A | 5/2007 |
| JP | 2011-223314 A | 11/2011 |

OTHER PUBLICATIONS

English Translation of JP Publication No. 2000-315930, published Nov. 14, 2000.
English Translation of JP Publication No. 2000-299615, published Oct. 24, 2000.
English Translation of JP Publication No. 2000-259048, published Sep. 22, 2000.
English Translation of JP Publication No. 2002-164245, published Jun. 7, 2002.
English Translation of JP Publication No. 2011-223314, published Nov. 4, 2011.
English Translation of JP Publication No. 7-226331, published Aug. 22, 1995.
English Translation of JP Publication No. 6-077756, published Mar. 18, 1994.
Communication dated Nov. 22, 2016 from the Japanese Patent Office in counterpart Application No. 2015-537440.
Shuo Wang et al., "Improvement of EMI Filter Performance With Parasitic Coupling Cancellation", IEEE Transactions on Power Electronics, Sep. 2005, pp. 96-103, vol. 20, No. 5.
International Search Report of PCT/JP2013/075004 dated Nov. 12, 2013 [PCT/ISA/210].
Communication dated Jun. 9, 2017, from the European Patent Office in counterpart European Application No. 13893859.2.
Communication dated Jun. 1, 2017, from the Chinese Patent Office in counterpart Application No. 201380079626.X.
Communication dated Oct. 9, 2017 from the State Intellectual Property Office of the P.R.C. in counterpart Chinese application No. 201380079626.X.
Communication dated May 22, 2018 from the European Patent Office in counterpart application No. 13893859.2.
Communication dated May 3, 2018, issued by the State Intellectual Property Office of the P.R.C. in counterpart Chinese application No. 201380079626.X.
Communication dated Dec. 3, 2018 from the European Patent Office in application No. 13893859.2.
Chinese Office Action dated Feb. 13, 2019 in Patent Application No. 201380079626.X.

\* cited by examiner

- Prior Art -

- Prior Art -

- Prior Art -

- Prior Art -

NOISE FILTER

CROSS REFERENCE TO RELATED APPLICATIONS

This application is a National Stage of International Application No. PCT/JP2013/075004, filed Sep. 17, 2013, the contents of which are incorporated herein by reference in its entirety.

TECHNICAL FIELD

The present invention relates to a noise filter.

BACKGROUND ART

As a conventional noise filter, a technology disclosed in Non-Patent Document 1 is known. This conventional noise filter is configured with two coils, two across-the-line condensers (hereinafter, referred to as an X condenser); the two coils are connected between the respective one terminals and the respective other terminals of the two X condensers; this noise filter is configured in such a way that there is provided a path through which an electric current having a direction opposite to the direction of an electric current flowing in the one of the two X condensers flows in the other one. In the conventional noise filter configured in such a manner as described above, because when an electric current flows in the one X condenser, an opposite-direction electric current flows in another path; therefore, magnetic fluxes generated by the electric currents flowing the respective paths are cancelled each other, so that magnetic coupling with the other X condenser is suppressed. As a result, the normal-mode attenuation amount in the noise filter is substantially improved.

Patent Document 1 discloses, as a circuit technology that can be utilized in a filter, a method of suppressing magnetic coupling between condensers by the way in which the respective condensers are arranged. In this method, a plurality of condensers that are connected in parallel with one another are arranged in such a way that the vector of an electric current flowing in one of the plurality of condensers is not parallel to the vector of an electric current flowing in another (adjacent) condenser, so that magnetic coupling between the condensers is suppressed.

PRIOR ART REFERENCE

Patent Document

[Patent Document 1] Japanese Patent Application Laid-Open No. 2001-23849

Non-Patent Document

[Non-Patent Document] Improvement of EMI Filter Performance With parasitic Coupling Cancellation (IEEE TRANSACTIONS ON POWER ELECTRONICS, VOL. 20, NO. 5, Sep. 2005)

DISCLOSURE OF THE INVENTION

Problems to be Solved by the Invention

However, in the conventional noise filter disclosed in Non-Patent Document 1, there has been a problem that no typical X condenser cannot be utilized and it is required to utilize an X condenser having a special structure. Moreover, in the circuit technology, disclosed in Patent Document 1, that can be utilized in a filter, there has been a problem that because the arrangement of condensers restricts the arrangement of circuit components and wiring leads, the circuit area is upsized in proportion to the number of condensers.

The present invention has been implemented in order to solve the foregoing problems in the conventional noise filters; the objective thereof is to provide a noise filter in which typical condensers can be utilized and magnetic coupling between the condensers can be suppressed regardless of the method of arranging the condensers.

Means for Solving the Problems

A noise filter according to the present invention includes a first film condenser and a second film condenser and is characterized in that the first film condenser and the second film condenser are arranged at a distance in which they are magnetically coupled with each other and are connected in parallel with each other by a first wiring lead for connecting one terminal of the first film condenser with one terminal of the second film condenser and a second wiring lead for connecting the other terminal of the first film condenser with the other terminal of the second film condenser, and in that the first wiring lead and the second wiring lead are arranged in such a way as to intersect each other odd-number times.

Moreover, a noise filter according to the present invention includes a first film condenser, a second film condenser, a first coil, and a second coil and is characterized in that the first film condenser and the second film condenser are arranged at a distance in which they are magnetically coupled with each other, in that there are provided a first wiring lead for connecting one terminal of the first film condenser with one terminal of the second coil and a second wiring lead for connecting the other terminal of the first film condenser with one terminal of the first coil, in that one terminal of the second film condenser is connected with the other terminal of the second coil, in that the other terminal of the second film condenser is connected with the other terminal of the first coil, and in that the first wiring lead and the second wiring lead are arranged in such a way as to intersect each other odd-number times.

Furthermore, a noise filter according to the present invention is provided with three or more film condensers including a first film condenser and a second film condenser, and is characterized in that the first film condenser and the second film condenser are arranged at a distance in which they are magnetically coupled with each other and are connected in parallel with each other by a first wiring lead for connecting one terminal of the first film condenser with one terminal of the second film condenser and a second wiring lead for connecting the other terminal of the first film condenser with the other terminal of the second film condenser, in that each of the film condensers other than the first film condenser and the second film condenser is connected in parallel with the first film condenser and the second film condenser, and in that the first wiring lead and the second wiring lead are arranged in such a way as to intersect each other odd-number times.

Moreover, a noise filter according to the present invention is provided with three or more film condensers including a first film condenser and a second film condenser, a first coil, and a second coil, and is characterized in that the first film condenser and the second film condenser are arranged at a distance in which they are magnetically coupled with each other, in that there are provided a first wiring lead for connecting one terminal of the first film condenser with one terminal of the second coil and a second wiring lead for connecting the other terminal of the first film condenser with one terminal of the first coil, in that one terminal of the second film condenser is connected with the other terminal of the second coil, in that the other terminal of the second film condenser is connected with the other terminal of the first coil, in that each of the film condensers other than the first film condenser and the second film condenser is connected in parallel with the first film condenser and the second film condenser, and in that at least one pair of wiring leads among the first and second wiring leads and respective pairs of wiring leads for connecting the film condensers in parallel with each other intersect each other odd-number times.

Furthermore, a noise filter according to the present invention includes a first film condenser, a second film condenser, a third film condenser, a first coil, a second coil, a third coil, and a fourth coil, and is characterized in that the first film condenser, the second film condenser, and the third film condenser are arranged at distances in which they are magnetically coupled with one another, in that there are provided a first wiring lead for connecting one terminal of the first film condenser with one terminal of the first coil, a second wiring lead for connecting the other terminal of the first film condenser with one terminal of the second coil, a third wiring lead for connecting one terminal of the third film condenser with the other terminal of the first coil, a fourth wiring lead for connecting the other terminal of the third film condenser with the other terminal of the second coil, a fifth wiring lead for connecting one terminal of the third film condenser with one terminal of the third coil, a sixth wiring lead for connecting the other terminal of the third film condenser with one terminal of the fourth coil, a seventh wiring lead for connecting one terminal of the second film condenser with the other terminal of the third coil, and an eighth wiring lead for connecting the other terminal of the second film condenser with the other terminal of the fourth coil, and in that in at least one of the respective wiring pairs between the first wiring lead and the second wiring lead, the third wiring lead and the fourth wiring lead, the fifth wiring lead and the sixth wiring lead, and the seventh wiring lead and the eighth wiring lead, the wiring leads intersect each other odd-number times.

Advantage of the Invention

A noise filter according to the present invention makes it possible to suppress magnetic coupling between condensers; therefore, the normal-mode attenuation characteristics of the noise filter can be improved.

BEST MODE FOR CARRYING OUT THE INVENTION

Embodiment 1

Figure 1:
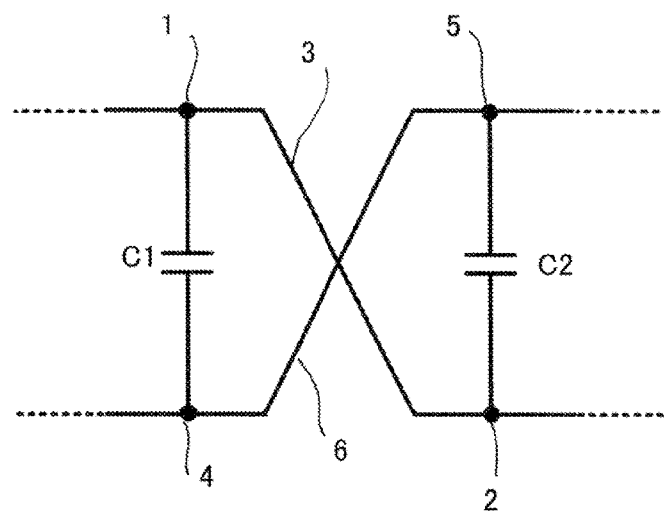
FIG. 1 is a circuit diagram for explaining a noise filter according to Embodiment 1 of the present invention.
Figure 2:
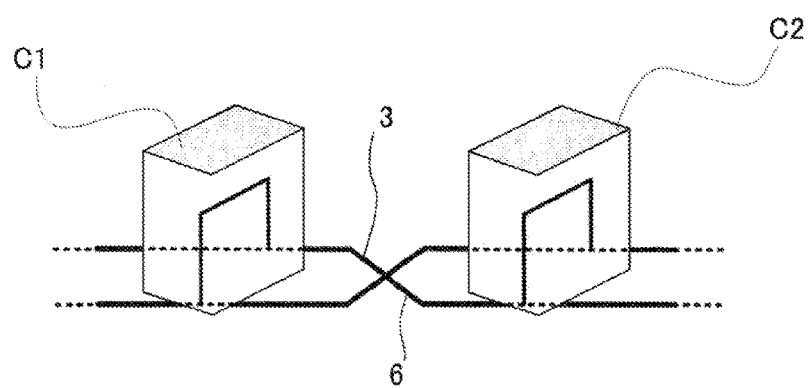
FIG. 2 is a perspective view schematically illustrating a noise filter according to Embodiment 1 of the present invention.

Hereinafter, a noise filter according to Embodiment 1 of the present invention will be explained. FIG. 1 is a circuit diagram for explaining a noise filter according to Embodiment 1 of the present invention; FIG. 2 is a perspective view schematically illustrating the noise filter according to Embodiment 1 of the present invention. As illustrated in FIGS. 1 and 2, the noise filter according to Embodiment 1 of the present invention is provided with a first X condenser C1 as a first condenser and a second X condenser C2 as a second condenser; the first X condenser C1 and the second X condenser C2 are connected in parallel with each other so as to form a filter circuit.

The noise filter configured in such a manner as described above is inserted between a power source and an electric apparatus or between the electric apparatus and a load of the electric apparatus; the filter circuit attenuates noise generated by the electric apparatus.

A first wiring lead 3 connects a terminal 1, one of the terminals of the first X condenser C1, with a terminal 2, one of the terminals of the second X condenser C2; a second wiring lead 6 connects a terminal 4, the other one of the terminals of the first X condenser C1, with a terminal 5, the other one of the terminals of the second X condenser C2. The first wiring lead 3 and the second wiring lead 6 are arranged in such a way as to intersect each other once. As described above, the noise filter configured in such a manner is inserted between the power source and the electric apparatus or between the electric apparatus and the load of the electric apparatus so as to attenuate noise generated by the electric apparatus. As illustrated in FIG. 2, the first and second X condensers C1 and C2 each denote a metalized film condenser that is utilized in a noise filter, in general, and are arranged in such a way as to be parallel to each other. The number of intersections between the first wiring lead 3 and the second wiring lead 6 is not limited to one; it is only necessary to be an odd number.

Hereinafter, there will be explained a mechanism in which in the noise filter according to Embodiment 1 of the present invention, the first and second wiring leads 3 and 6 for connecting the first and second X condensers C1 and C2 intersect each other once so that the normal-mode attenuation characteristics of the noise filter is improved.

Figure 3:
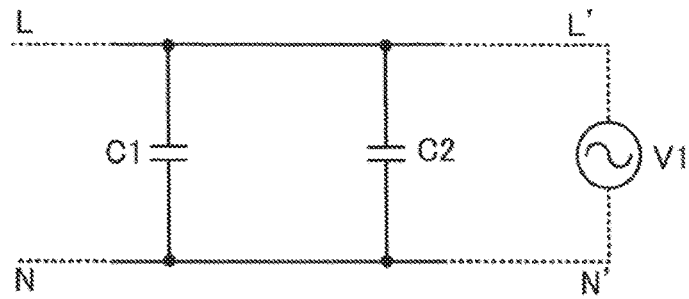
FIG. 3 is a circuit diagram for explaining a conventional noise filter.
Figure 4:
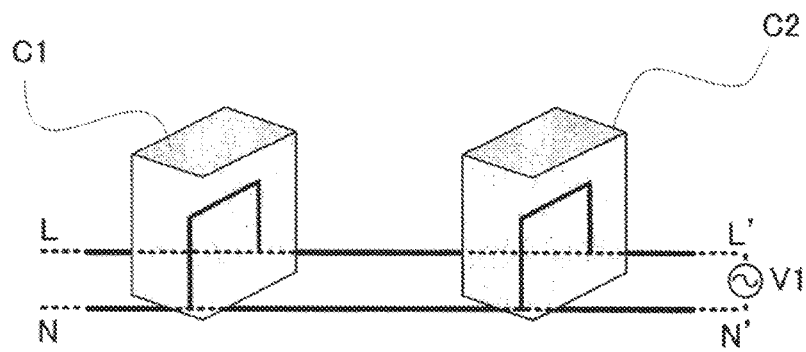
FIG. 4 is a perspective view schematically illustrating the conventional noise filter.

At first, in order to understand the noise filter according to Embodiment 1 of the present invention, a conventional noise filer will be explained. FIG. 3 is a circuit diagram for explaining a conventional noise filter; the conventional noise filter is provided with the first X condenser C1 and the second X condenser C2, which are the constituent elements the same as those provided in the noise filter according to Embodiment 1 of the present invention; however, the conventional noise filter is different from the noise filter according to Embodiment 1 of the present invention in that the wiring leads for connecting the first and second X condensers C1 and C2 do not intersect each other. FIG. 4 is a perspective view schematically illustrating the conventional noise filter. It is assumed that in FIGS. 3 and 4, the noise filter is connected between a power source and an electric apparatus, that the first X condenser C1 is situated at the power source side and the second X condenser C2 is situated at the electric apparatus side, and that a noise source V1 exists in the electric apparatus.

Figure 5:
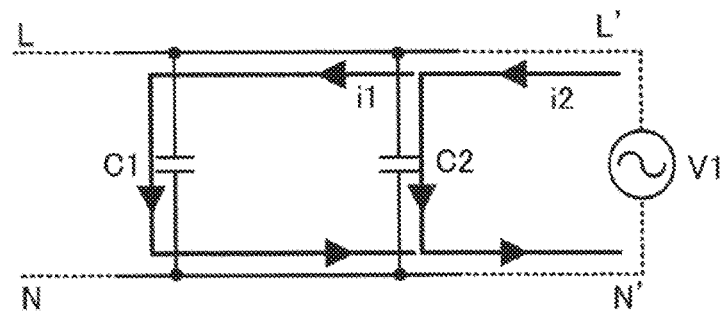
FIG. 5 is an explanatory diagram representing current paths through which normal-mode noise currents flow in X condensers in the conventional noise filter.
Figure 6:
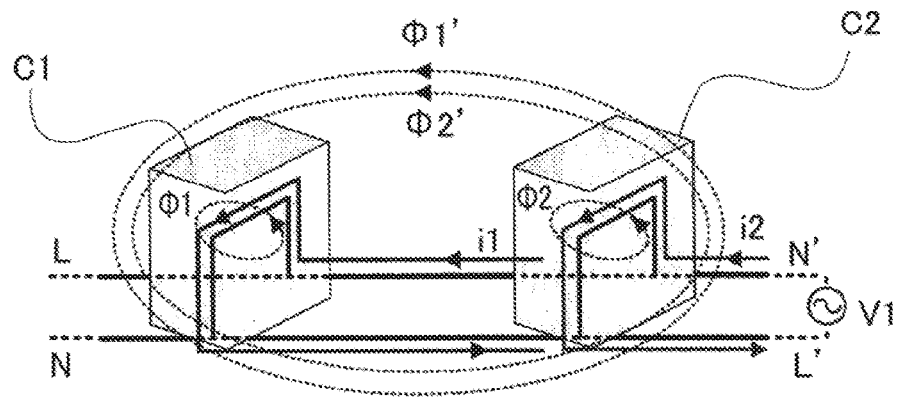
FIG. 6 is a perspective view schematically illustrating the current paths through which the normal-mode noise currents flow in the X condensers and the magnetic fluxes generated by the normal-mode currents in the conventional noise filter.

At first, the current path of a normal-mode noise current will be explained. FIG. 5 is an explanatory diagram representing current paths through which normal-mode noise currents flow in the X condensers in the conventional noise filter; there is illustrated current paths through which normal-mode noise currents generated by the noise source V1 flow in the first and second X condensers C1 and C2. FIG. 6 is a perspective view schematically illustrating the current paths through which the normal-mode noise currents flow in the X condensers and the magnetic fluxes generated by the normal-mode currents in the conventional noise filter.

In FIGS. 5 and 6, i1 denotes a normal-mode noise current that flows in the first X condenser C1; i2 denotes a normal-mode noise current that flows in the second X condenser C2. In FIG. 6, $\Phi 1$, $\Phi 2$, $\Phi 1'$, and $\Phi 2'$ denote magnetic flux generated by the first X condenser C1, magnetic flux generated by the second X condenser C2, magnetic flux, out of the magnetic flux $\Phi 1$, that is interlinked with the second X condenser C2, and magnetic flux, out of the magnetic flux $\Phi 2$, that is interlinked with the first X condenser C1, respectively.

In FIG. 6, the normal-mode noise currents i1 and i2 having the same direction flow in the first X condenser C1 and the second X condenser C2; therefore, the direction of the magnetic flux $\Phi 1'$ is the same as that of the magnetic flux $\Phi 2'$ (in that direction, the magnetic flux $\Phi 1'$ and the magnetic flux $\Phi 2'$ strengthen each other). Accordingly, the first X condenser C1 and the second X condenser C2 strongly couple with each other; thus, the normal-mode attenuation characteristics of the noise filter is deteriorated.

Figure 7:
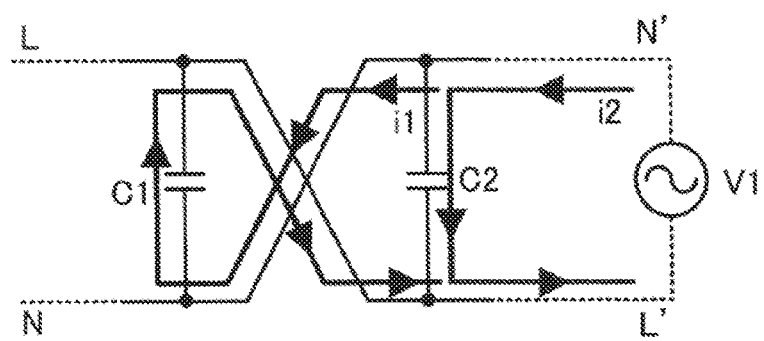
FIG. 7 is an explanatory diagram representing current paths through which normal-mode noise currents flow in X condensers in the noise filter according to Embodiment 1 of the present invention.
Figure 8:
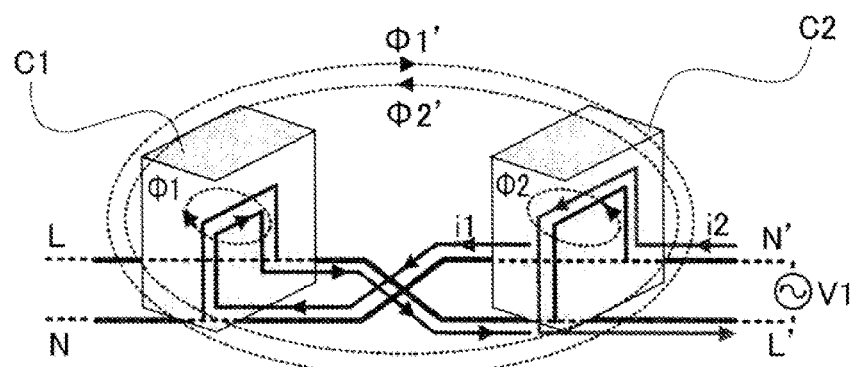
FIG. 8 is a perspective view schematically illustrating the current paths through which the normal-mode noise currents flow in the X condensers and the magnetic fluxes generated by the normal-mode currents in the noise filter according to Embodiment 1 of the present invention.

Next, the noise filter according to Embodiment 1 of the present invention will be explained. FIG. 7 is an explanatory diagram representing current paths through which normal-mode noise currents flow in X condensers in the noise filter according to Embodiment 1 of the present invention; FIG. 8 is a perspective view schematically illustrating the current paths through which the normal-mode noise currents flow in the X condensers and the magnetic fluxes generated by the normal-mode currents in the noise filter according to Embodiment 1 of the present invention. As illustrated in FIGS. 7 and 8, in the noise filter according to Embodiment 1 of the present invention, because the respective wiring leads for connecting the first X condenser C1 and the second X condenser C2 intersect each other once, respective normal-mode noise currents having opposite directions flow in the first X condenser C1 and the second X condenser C2; thus, the direction of the magnetic flux $\Phi 1'$ is opposite to that of the magnetic flux $\Phi 2'$ (in those directions, the magnetic flux $\Phi 1'$ and the magnetic flux $\Phi 2'$ cancel each other).

As described above, when the respective wiring leads for performing connection between the X condensers intersect each other once, it is made possible to suppress the magnetic coupling between the X condensers; thus, the normal-mode attenuation effect of the noise filter can be improved.

In Embodiment 1, the noise filter is configured in such a manner that the respective wiring leads for connecting the first X condenser C1 and the second X condenser C2 intersect each other once; however, the number of intersection instances is not limited thereto, and the respective wiring leads may intersect each other once or more times as long as the number is odd. When the number of intersection instances is odd, normal-mode noise currents having opposite directions flow in the first X condenser C1 and the second X condenser C2; therefore, the attenuation characteristics of the noise filter can be improved. Moreover, in the noise filter according to Embodiment 1 of the present invention, the first X condenser C1 is situated at the power source side; however, the position of the first X condenser C1 is not limited thereto, and even when the first X condenser C1 is situated at the electric-apparatus load side, the attenuation characteristic of the noise filter can be improved in a similar manner.

Embodiment 2

Figure 9:
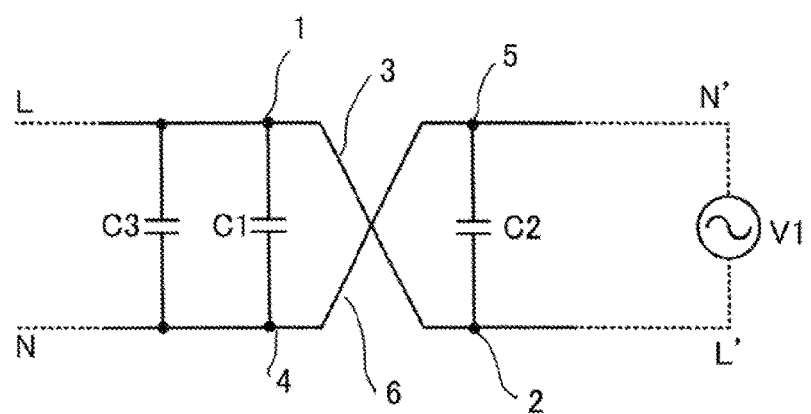
FIG. 9 is a circuit diagram for explaining a noise filter according to Embodiment 2 of the present invention.
Figure 10:
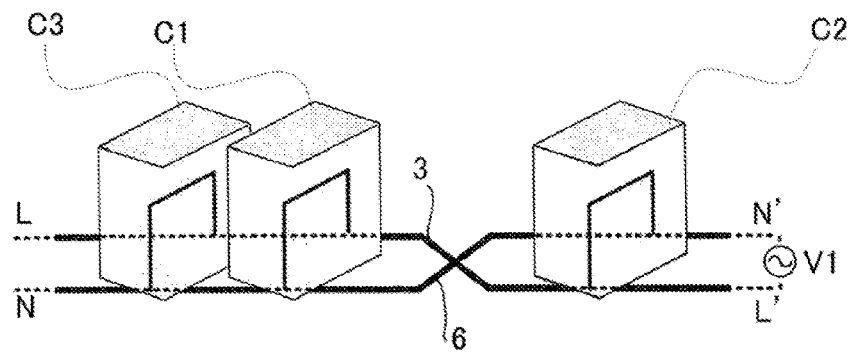
FIG. 10 is a perspective view schematically illustrating the noise filter according to Embodiment 2 of the present invention.

Next, a noise filter according to Embodiment 2 of the present invention will be explained. FIG. 9 is a circuit diagram for explaining a noise filter according to Embodiment 2 of the present invention; FIG. 10 is a perspective view schematically illustrating the noise filter according to Embodiment 2 of the present invention. In FIGS. 9 and 10, the noise filter according to Embodiment 2 of the present invention is provided with the first X condenser C1, as a first X condenser, the second X condenser C2, as a second X condenser, and a third X condenser C3, as a third X condenser. The first, second, and third X condensers C1, C2, and C3 are connected in parallel with one another and form a filter circuit.

The noise filter configured in such a manner as described above is inserted between a power source and an electric apparatus or between the electric apparatus and a load of the electric apparatus and attenuates noise generated by the electric apparatus.

The first wiring lead 3 connects the terminal 1, one of the terminals of the first X condenser C1, with the terminal 2, one of the terminals of the second X condenser C2; the second wiring lead 6 connects the terminal 4, the other one of the terminals of the first X condenser C1, with the terminal 5, the other one of the terminals of the second X condenser C2. The first wiring lead 3 and the second wiring lead 6 are arranged in such a way as to intersect each other once. As described above, the noise filter configured in such a manner is inserted between the power source and the electric apparatus or between the electric apparatus and the load of the electric apparatus so as to attenuate noise generated by the electric apparatus. As illustrated in FIG. 2, the first and second X condensers C1 and C2 each denote a metalized film condenser that is utilized in a noise filter, in general, and are arranged in such a way as to be parallel to each other.

The third X condenser C3, which is a condenser other than the first and second X condensers C1 and C2, is connected in parallel with each of the first and second X condensers C1 and C2. The first wiring lead 3 and the second wiring lead 6 are arranged in such a way as to intersect each other once. As illustrated in FIG. 10, the first, second, and third X condensers C1, C2, and C3 each denote a metalized film condenser that is utilized in a noise filter, in general, and are arranged in such a way as to be parallel to one another. The other configurations are the same as those in Embodiment 1. As illustrated in FIGS. 9 and 10, it is assumed that the noise source V1 exists at the electric apparatus side.

The number of intersections between the first wiring lead 3 and the second wiring lead 6 is not limited to one; it is only necessary to be an odd number. There may be provided an X condenser, which is further another X condenser that is connected in parallel with each of the first through third X condensers C1, C2, and C3.

Figure 11:
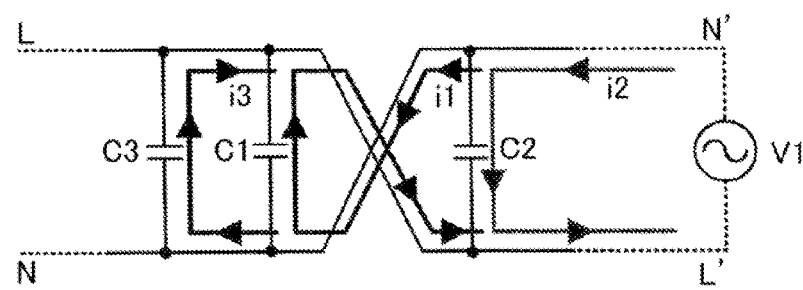
FIG. 11 is an explanatory diagram representing current paths through which normal-mode noise currents flow in X condensers in the noise filter according to Embodiment 2 of the present invention.
Figure 12:
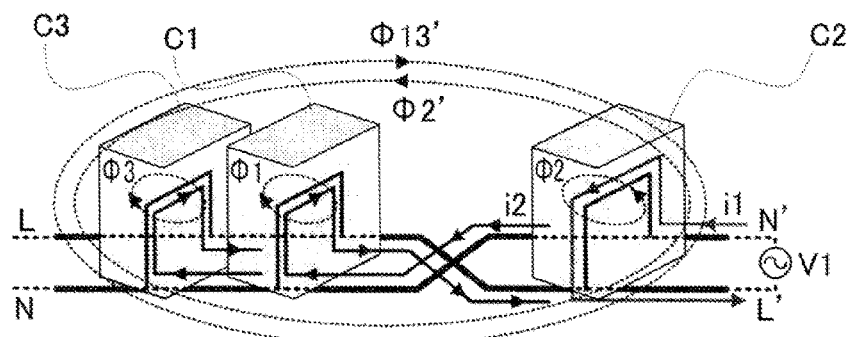
FIG. 12 is a perspective view schematically illustrating the current paths through which the normal-mode noise currents flow in the X condensers and the magnetic fluxes generated by the normal-mode currents in the noise filter according to Embodiment 2 of the present invention.

In the noise filter according to Embodiment 2 of the present invention, the mechanism of improving the attenuation characteristics of the noise filter is basically the same as the mechanism in the noise filter according to Embodiment 1. FIG. 11 is an explanatory diagram representing current paths through which normal-mode noise currents flow in the X condensers in the noise filter according to Embodiment 2 of the present invention; there is illustrated current paths through which normal-mode noise currents generated by the noise source V1 flow in the first through third X condensers C1, C2, and C3. FIG. 12 is a perspective view schematically illustrating the current paths through which the normal-mode noise currents flow in the X condensers and the magnetic fluxes generated by the normal-mode currents in the noise filter according to Embodiment 2 of the present invention.

In FIGS. 11 and 12, i1 denotes a normal-mode noise current that flows in the first X condenser C1; i2 denotes a normal-mode noise current that flows in the second X condenser C2; furthermore, i3 denotes a normal-mode noise current that flows in the third X condenser C3. In FIG. 12, $\Phi1$, $\Phi2$, and $\Phi3$ denote magnetic flux generated by the first X condenser C1, magnetic flux generated by the second X condenser C2, and magnetic flux generated by the third X condenser C3, respectively. In addition, $\Phi13'$ denotes magnetic flux obtained by combining the magnetic fluxes, out of the magnetic fluxes $\Phi1$ and $\Phi3$, that are interlinked with the second X condenser C2; $\Phi2'$ denotes magnetic flux, out of the magnetic fluxes $\Phi2$, that are interlinked with the first and second X condensers C1 and C2.

In FIGS. 11 and 12, the normal-mode noise currents i1 and i3 having the same direction flow in the first X condenser C1 and the third X condenser C3; therefore, the direction of the magnetic flux $\Phi1$ is the same as that of the magnetic flux $\Phi3$ (in that direction, the magnetic flux $\Phi1$ and the magnetic flux $\Phi3$ strengthen each other). In contrast, because the respective wiring leads for connecting the first X condenser C1 and the second X condenser C2 intersect each other once, a normal-mode noise current flows in the second X condenser C2 in a direction opposite to the directions of normal-mode noise currents in the first X condenser C1 and the third X condenser C3; thus, the direction of the magnetic flux $\Phi13'$ is opposite to that of the magnetic flux $\Phi2'$ (in those directions, the magnetic flux $\Phi13'$ and the magnetic flux $\Phi2'$ cancel each other).

As a result, the respective magnetic coupling instances among the first through third X condensers C1, C2, and C3 can be suppressed. Accordingly, in the noise filter configured with three or more X condensers that are connected in parallel with one another, when the direction of a normal-mode noise current in at least one X condenser is made to be opposite to the directions of normal-mode noise currents in the other X condensers, magnetic coupling instances among the X condensers can be suppressed.

Due to the foregoing operational principle, as is the case with the noise filter according to Embodiment 1, magnetic coupling instances among the X condensers can be suppressed also in the noise filter according to Embodiment 2 of the present invention; thus, the noise-mode attenuation effect of the noise filter can be improved.

In Embodiment 2, the third X condenser C3 is situated at the power source side and the second X condenser C2 is situated at the electric apparatus side; however, the arrangement of the X condensers is not limited thereto. Even when the second X condenser C2 is situated at the power source side and the third X condenser C3 is situated at the electric apparatus side, the attenuation characteristics of the noise filter can also be improved. Moreover, in the noise filter according to Embodiment 2, the third X condenser C3 is situated at the power source side and the second X condenser C2 is situated at the electric apparatus side; however, the arrangement of the X condensers is not limited thereto. Even when the second X condenser C2 is situated at the load side and the third X condenser C3 is situated at the electric apparatus side, the attenuation characteristics of the noise filter can also be improved. Furthermore, in the noise filter according to Embodiment 2, the third X condenser C3 is situated at the power source side and the second X condenser C2 is situated at the electric apparatus side; however, the arrangement of the X condensers is not limited thereto. Even when the second X condenser C2 is situated at the electric apparatus side and the third X condenser C3 is situated at the load side, the attenuation characteristics of the noise filter can also be improved.

Embodiment 3

Figure 13:
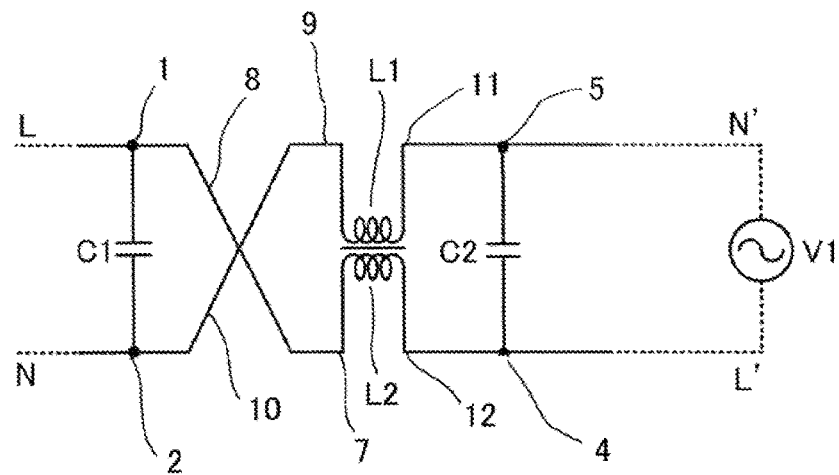
FIG. 13 is a circuit diagram for explaining a noise filter according to Embodiment 3 of the present invention.
Figure 14:
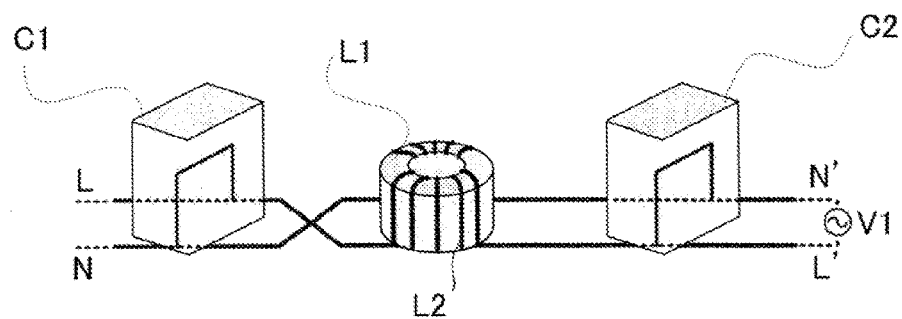
FIG. 14 is a perspective view schematically illustrating the noise filter according to Embodiment 3 of the present invention.

Next, a noise filter according to Embodiment 3 of the present invention will be explained. FIG. 13 is a circuit diagram for explaining a noise filter according to Embodiment 3 of the present invention; FIG. 14 is a perspective view schematically illustrating the noise filter according to Embodiment 3 of the present invention. As illustrated in FIGS. 13 and 14, the noise filter according to Embodiment 3 of the present invention is provided with a filter circuit including the first X condenser C1, as a first X condenser, the second X condenser C2, as a second X condenser, a first coil L1, and a second coil L2. The first coil L1 and the second coil L2 form a common-mode choke coil. The first and second X condensers C1 and C2 and the common-mode choke coil including the first and second coils L1 and L2 form a filter circuit.

The noise filter configured in such a manner as described above is inserted between a power source and an electric apparatus or between the electric apparatus and a load of the electric apparatus and attenuates noise generated by the electric apparatus. As illustrated in FIGS. 13 and 14, it is assumed that the noise source V1 exists at the electric apparatus side.

A first wiring lead 8 connects one terminal 1 of the first X condenser C1 with one terminal 7 of the second coil L2; a second wiring lead 10 connects the other terminal 2 of the first X condenser C1 with one terminal 9 of the first coil L1. The first wiring lead 8 and the second wiring lead 10 are arranged in such a way as to intersect each other once. One terminal 4 of the second X condenser C2 is connected with the other terminal 12 of the second coil L2; the other terminal 5 of the second X condenser C2 is connected with the other terminal 11 of the first coil L1.

The number of intersections between the first wiring lead 8 and the second wiring lead 10 is not limited to one; it is only necessary to be an odd number.

Figure 15:
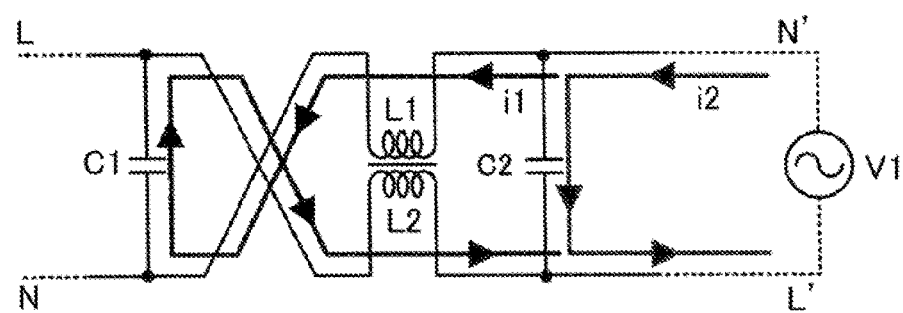
FIG. 15 is an explanatory diagram representing current paths through which normal-mode noise currents flow in X condensers in the noise filter according to Embodiment 3 of the present invention.
Figure 16:
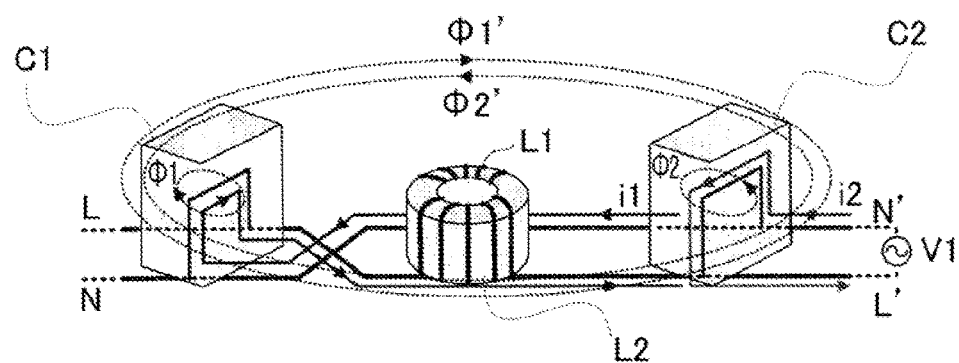
FIG. 16 is a perspective view schematically illustrating the current paths through which the normal-mode noise currents flow in the X condensers and the magnetic fluxes generated by the normal-mode currents in the noise filter according to Embodiment 3 of the present invention.

In the noise filter according to Embodiment 3 of the present invention, the mechanism of improving the attenuation characteristics of the noise filter is the same as the mechanism in the noise filter according to Embodiment 1. FIG. 15 is an explanatory diagram representing current paths through which normal-mode noise currents flow in the X condensers in the noise filter according to Embodiment 3 of the present invention. FIG. 16 is a perspective view schematically illustrating the current paths through which the normal-mode noise currents flow in the X condensers and the magnetic fluxes generated by the normal-mode currents in the noise filter according to Embodiment 3 of the present invention.

In FIGS. 15 and 16, i1 denotes a normal-mode noise current that flows in the first X condenser C1; i2 denotes a normal-mode noise current that flows in the second X condenser C2. In FIG. 16, Φ1, Φ2, Φ1', and Φ2' denote magnetic flux generated by the first X condenser C1, magnetic flux generated by the second X condenser C2, magnetic flux, out of the magnetic flux Φ1, that is interlinked with the second X condenser C2, and magnetic flux, out of the magnetic flux Φ2, that is interlinked with the first X condenser C1, respectively.

In FIGS. 15 and 16, the wiring leads for connecting the first X condenser C1 with the common-mode choke coil including the first and second coils L1 and L2 intersect each other once so that as is the case with the noise filter according to Embodiment 1, respective normal-mode noise currents having opposite directions flow in the first and second X condensers C1 and C2. The respective directions of the magnetic flux Φ1 and the magnetic flux Φ2 are opposite to each other (in those directions, the magnetic flux Φ1 and the magnetic flux Φ2 cancel each other). As a result, the magnetic coupling between the first X condenser C1 and the second X condenser C2 can be suppressed.

Figure 17:
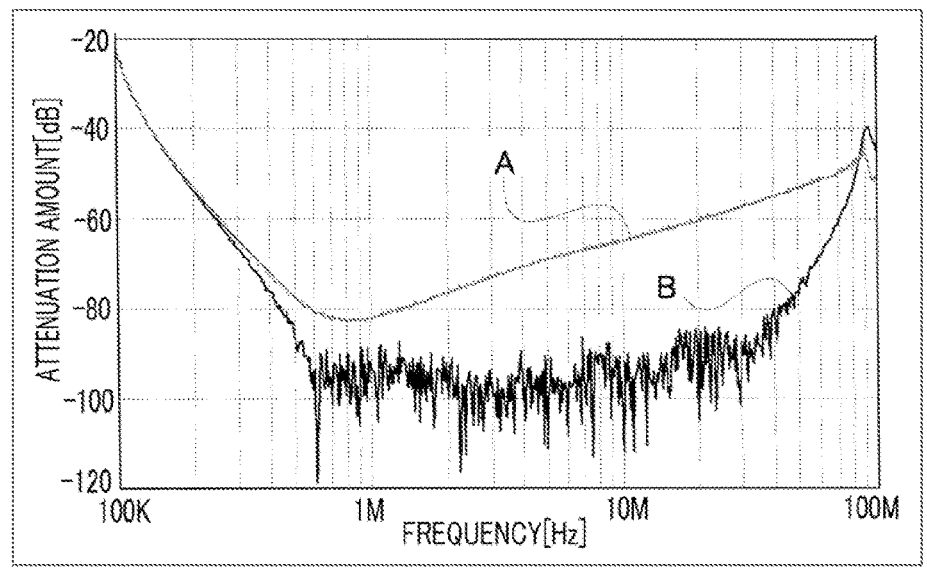
FIG. 17 is a characteristic graph representing the noise attenuation characteristics of the noise filter according to Embodiment 3 of the present invention.

FIG. 17 is a characteristic graph representing the noise attenuation characteristics of the noise filter according to Embodiment 3 of the present invention; the abscissa denotes the frequency and the ordinate denotes the gain (the noise attenuation amount). The smaller the value of the gain is, the larger the noise attenuation amount is. In FIG. 17, a broken line A represents the noise attenuation characteristics of a noise filter (a conventional noise filter) at a time when the wiring leads for connecting the first X condenser C1 with the common-mode choke coil including the first and second coils L1 and L2 do not intersect each other odd-number times. A solid line B represents the noise attenuation characteristics of the noise filter according to Embodiment 3 of the present invention. As evident from FIG. 17, it can be ascertained that the noise attenuation characteristics of the noise filter according to Embodiment 3 of the present invention is improved in comparison with those of the conventional noise filter.

As described above, even in the case of a configuration in which the common-mode choke coil including the first and second coils L1 and L2 is connected between the first X condenser C1 and the second X condenser C2, when the respective wiring leads for connecting the first X condenser C1 and the common-mode choke coil intersect each other once, it is made possible to suppress the magnetic coupling between the X condensers; thus, the normal-mode attenuation characteristics of the noise filter can be improved.

In the case of the noise filter according to Embodiment 3 of the present invention, there has been illustrated a configuration in which the respective wiring leads for connecting the first X condenser C1 and the common-mode choke coil including the first and the second coils L1 and L2 intersect each other once; however, the number of intersection instances is not limited thereto and the respective wiring leads may intersect each other once or more times as long as the number of intersection instances is an odd number. Moreover, the respective wiring leads for connecting the second X condenser C2 and the common-mode choke coil including the first and the second coils L1 and L2 may intersect each other odd-number times; even in this case, the attenuation effect of the noise filter can be improved.

In the case of the noise filter according to Embodiment 3, there has been illustrated a configuration in which the common-mode choke coil including the first and second coils L1 and L2 is utilized; however, the present invention is not limited thereto and the first and second choke coils may be formed of respective normal-mode choke coils. The normal-mode inductance value of a common-mode choke coil is a low value, in general; therefore, when two normal-mode choke coils are utilized, the attenuation effect can be obtained at a low frequency range.

Furthermore, in the noise filter according to Embodiment 3, the first X condenser C1 is situated at the power source side and the second X condenser C2 is situated at the electric apparatus side; however, the arrangement of the X condensers is not limited thereto. Even when the second X condenser C2 is situated at the power source side and the first X condenser C1 is situated at the electric apparatus side, the attenuation characteristics of the noise filter can also be improved. Moreover, in the noise filter according to Embodiment 3, the first X condenser C1 is situated at the power source side and the second X condenser C2 is situated at the electric apparatus side; however, the arrangement of the X condensers is not limited thereto. Even when the second X condenser C2 is situated at the load side and the first X condenser C1 is situated at the electric apparatus side, the attenuation characteristics of the noise filter can also be improved. Furthermore, in the noise filter according to Embodiment 3, the first X condenser C1 is situated at the power source side and the second X condenser C2 is situated at the electric apparatus side; however, the arrangement of the X condensers is not limited thereto. Even when the second X condenser C2 is situated at the electric apparatus side and the first X condenser C1 is situated at the load side, the attenuation characteristics of the noise filter can also be improved.

Embodiment 4

Figure 18:
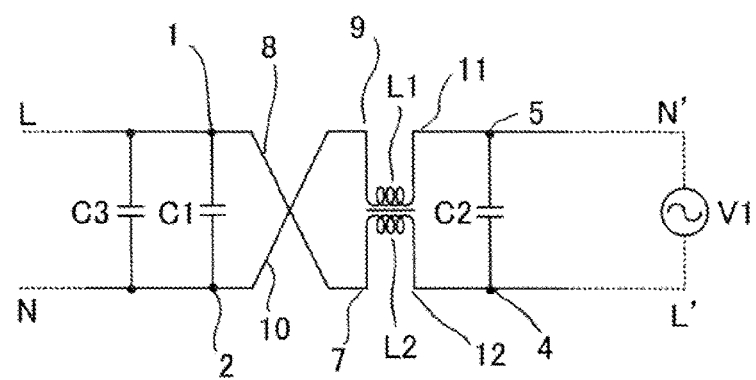
FIG. 18 is a circuit diagram for explaining a noise filter according to Embodiment 4 of the present invention.
Figure 19:
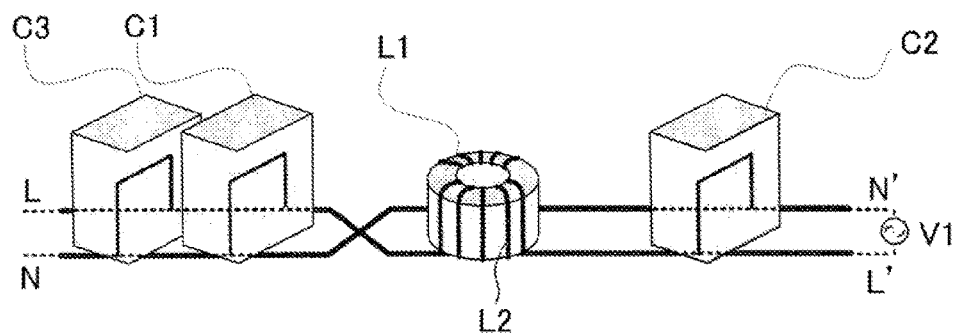
FIG. 19 is a perspective view schematically illustrating the noise filter according to Embodiment 4 of the present invention.

Next, a noise filter according to Embodiment 4 of the present invention will be explained. FIG. 18 is a circuit diagram for explaining a noise filter according to Embodiment 4 of the present invention; FIG. 19 is a perspective view schematically illustrating the noise filter according to Embodiment 4 of the present invention. As illustrated in FIGS. 18 and 19, the noise filter according to Embodiment 4 of the present invention is provided with a filter circuit including the first X condenser C1, as a first condenser, the second X condenser C2, as a second condenser, the third X condenser C3, as a third condenser, and a common-mode choke coil including the first coil L1 and the second coil L2.

The noise filter configured in such a manner as described above is inserted between a power source and an electric apparatus or between the electric apparatus and a load of the electric apparatus; the filter circuit attenuates noise in a main circuit. As illustrated in FIGS. 18 and 19, it is assumed that the noise source V1 exists at the electric apparatus side.

A first wiring lead 8 connects one terminal 1 of the first X condenser C1 with one terminal 7 of the second coil L2; a second wiring lead 10 connects the other terminal 2 of the first X condenser C1 with one terminal 9 of the first coil L1. The first wiring lead 8 and the second wiring lead 10 are arranged in such a way as to intersect each other once. One terminal 4 of the second X condenser C2 is connected with the other terminal 12 of the second coil L2; the other terminal 5 of the second X condenser C2 is connected with the other terminal 11 of the first coil L1. The third X condenser C3 is connected in parallel with the second X condenser C2.

The number of intersections between the first wiring lead 8 and the second wiring lead 10 is not limited to one; it is only necessary to be an odd number.

Figure 20:
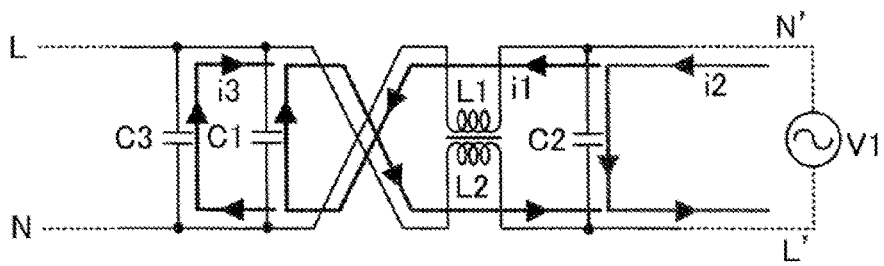
FIG. 20 is an explanatory diagram representing current paths through which normal-mode noise currents flow in X condensers in the noise filter according to Embodiment 4 of the present invention.
Figure 21:
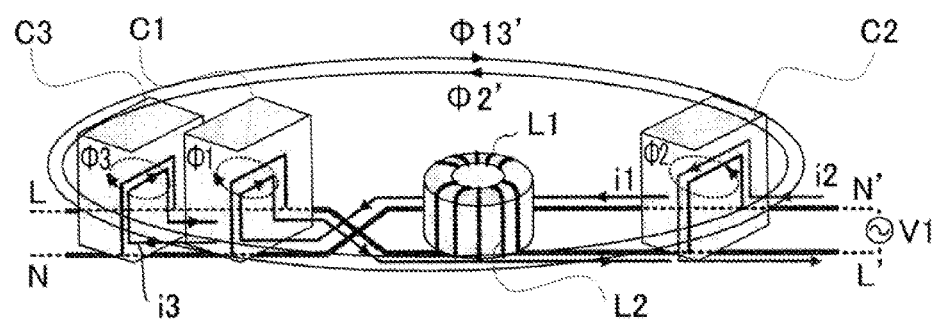
FIG. 21 is a perspective view schematically illustrating the current paths through which the normal-mode noise currents flow in the X condensers and the magnetic fluxes generated by the normal-mode currents in the noise filter according to Embodiment 4 of the present invention.

At first, the current path of a normal-mode noise current will be explained. FIG. 20 is an explanatory diagram representing current paths through which normal-mode noise currents flow in X condensers in the noise filter according to Embodiment 4 of the present invention; FIG. 21 is a perspective view schematically illustrating the current paths through which the normal-mode noise currents flow in the X condensers and the magnetic fluxes generated by the normal-mode currents in the noise filter according to Embodiment 4 of the present invention.

In FIGS. 20 and 21, i1 denotes a normal-mode noise current that flows in the first X condenser C1; i2 denotes a normal-mode noise current that flows in the second X condenser C2; i3 denotes a normal-mode noise current that flows in the third X condenser C3. In FIG. 21, $\Phi 1$, $\Phi 2$, and $\Phi 3$ denote magnetic flux generated by the first X condenser C1, magnetic flux generated by the second X condenser C2, and magnetic flux generated by the third X condenser C3, respectively. In addition, $\Phi 13'$ denotes magnetic flux obtained by combining the magnetic fluxes, out of the magnetic fluxes D1 and $\Phi 3$, that are interlinked with the second X condenser C2; $\Phi 2'$ denotes magnetic flux, out of the magnetic fluxes $\Phi 2$, that are interlinked with the first and second X condensers C1 and C2.

In FIGS. 20 and 21, the normal-mode noise currents i1 and i3 having the same direction flow in the first X condenser C1 and the third X condenser C3; therefore, the direction of the magnetic flux $\Phi 1$ is the same as that of the magnetic flux $\Phi 3$ (in that direction, the magnetic flux $\Phi 1$ and the magnetic flux $\Phi 3$ strengthen each other). In contrast, because the respective wiring leads for connecting the first X condenser C1 with the common-mode choke coil including the first and second choke coils L1 and L2 intersect each other once, a normal-mode noise current flows in the second X condenser C2 in a direction opposite to the directions of normal-mode noise currents in the first X condenser C1 and the third X condenser C3; thus, the direction of the magnetic flux $\Phi 3'$ is opposite to that of the magnetic flux $\Phi 2'$ (in those directions, the magnetic flux $\Phi 3'$ and the magnetic flux $\Phi 2'$ cancel each other). As a result, the respective magnetic coupling instances among the first through third X condensers C1, C2, and C3 can be suppressed.

The noise filter according to Embodiment 4 is configured in such a way that the respective wiring leads for connecting the first X condenser C1 and the common-mode choke coil including the first and the second coils L1 and L2 intersect each other once; however, the number of intersection instances is not limited thereto and the respective wiring leads may intersect each other once or more times as long as the number of intersection instances is an odd number. Moreover, even when the noise filter according to Embodiment 4 is configured in such a way that the respective wiring leads for connecting the second X condenser C2 and the common-mode choke coil including the first and the second coils L1 and L2 intersect each other odd-number times; the attenuation effect of the noise filter can be improved.

Embodiment 5

Figure 22:
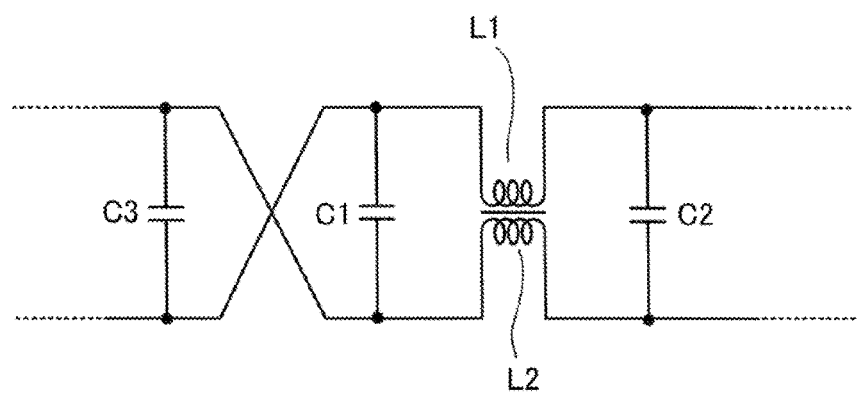
FIG. 22 is a circuit diagram for explaining a noise filter according to Embodiment 5 of the present invention.
Figure 23:
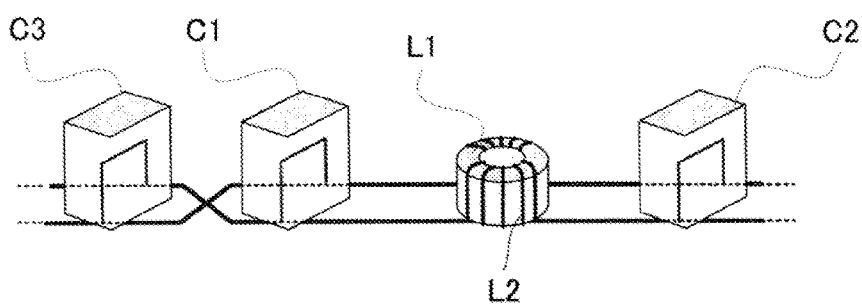
FIG. 23 is a perspective view schematically illustrating the noise filter according to Embodiment 5 of the present invention.

Next, a noise filter according to Embodiment 5 of the present invention will be explained. FIG. 22 is a circuit diagram for explaining a noise filter according to Embodiment 5 of the present invention; FIG. 23 is a perspective view schematically illustrating the noise filter according to Embodiment 5 of the present invention. As illustrated in FIGS. 22 and 23, the noise filter according to Embodiment 5 of the present invention is provided with a filter circuit including the first X condenser C1, as a first condenser, the second X condenser C2, as a second condenser, the third X condenser, as a third condenser, and a common-mode choke coil including the first coil L1 and the second coil L2. In addition, the noise filter according to Embodiment 5 is configured in such a way that the respective wiring leads for connecting the first X condenser C1 with the third X condenser C3 intersect each other odd-number times.

In FIGS. 22 and 23, because the respective wiring leads for connecting the first X condenser C1 with the third X condenser C3 intersect each other once, respective normal-mode noise currents having opposite directions flow in the first and third X condensers C1 and C3. Accordingly, the respective directions of magnetic fluxes generated by those normal-mode noise currents are opposite to each other (in those directions, the respective magnetic fluxes cancel each other). As a result, the respective magnetic coupling instances among the first through third X condensers C1, C2, and C3 can be suppressed. In the case where an X condenser is further connected with the second X condenser C2 or the third X condenser C3, the respective wiring leads for connecting that X condenser with the second X condenser C2 or the third X condenser C3 are made to intersect each other odd-number times, so that the magnetic coupling can be suppressed.

The noise filter according to Embodiment 5 is configured in such a manner that the respective wiring leads for connecting the first X condenser C1 with the third X condenser C3 intersect each other once; however, the number of intersection instances is not limited thereto, and the respective wiring leads may intersect each other once or more times as long as the number is odd.

Figure 24:
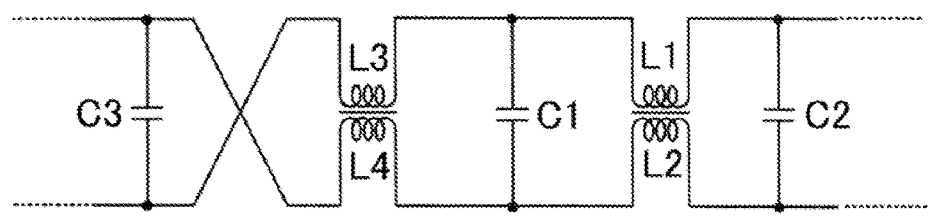
FIG. 24 is a circuit diagram representing a noise filter that is a variant example of the noise filter according to Embodiment 5 of the present invention and in which two common-mode choke coils are utilized.
Figure 25:
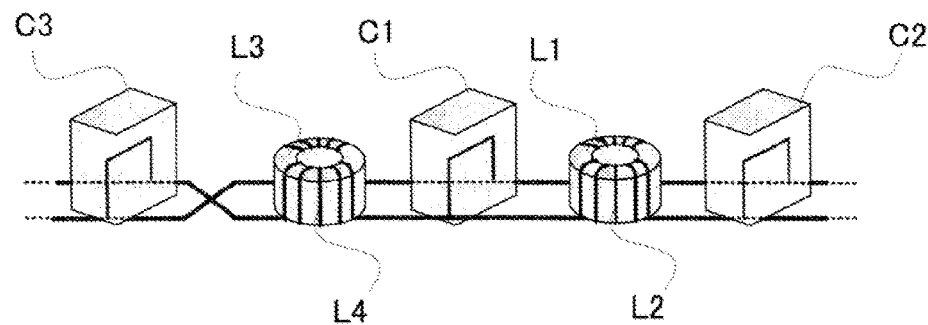
FIG. 25 is a perspective view schematically illustrating the noise filter that is a variant example of the noise filter according to Embodiment 5 of the present invention.

In each of Embodiments 4 and 5, a single common-mode choke coil is configured with the first and second coils L1 and L2; however, the present invention is not limited thereto and it may be allowed that two or more common-mode choke coils configured in the same manner are provided. FIG. 24 is a circuit diagram representing a noise filter that is a variant example of the noise filter according to Embodiment 5 of the present invention and in which two common-mode choke coils are utilized; FIG. 25 is a perspective view schematically illustrating the noise filter that is a variant example of the noise filter according to Embodiment 5 of the present invention. Alternatively, it may be allowed that each of the first and second coils L1 and L2 is formed of a normal-mode choke coil. The normal-mode inductance value of a common-mode choke coil is a low value, in general; therefore, when two common-mode choke coils or two normal-mode choke coils are utilized, the attenuation effect can be obtained at a low frequency range.

Moreover, in each of Embodiments 4 and 5, the third X condenser C3 is situated at the power source side and the second X condenser C2 is situated at the electric apparatus side; however, the arrangement of the X condensers is not limited thereto. Even when the second X condenser C2 is situated at the power source side and the third X condenser C3 is situated at the electric apparatus side, the attenuation characteristics of the noise filter can also be improved. Moreover, in each of Embodiments 4 and 5, the third X condenser C3 is situated at the power source side and the second X condenser C2 is situated at the electric apparatus side; however, the arrangement of the X condensers is not limited thereto. Even when the second X condenser C2 is situated at the load side and the third X condenser C3 is situated at the electric apparatus side, the attenuation characteristics of the noise filter can also be improved. Still moreover, in each of Embodiments 4 and 5, the third X condenser C3 is situated at the power source side and the second X condenser C2 is situated at the electric apparatus side; however, the arrangement of the X condensers is not limited thereto. Even when the second X condenser C2 is situated at the electric apparatus side and the third X condenser C3 is situated at the load side, the attenuation characteristics of the noise filter can also be improved.

In each of Embodiments 1 through 5, the constituent components of the noise filter are connected by wiring leads; however, the present invention is not limited thereto and it may be allowed that the constituent components are mounted on a circuit board and the wiring leads are formed of circuit-board strip conductors.

Furthermore, in each of Embodiments 1 through 5, the constituent components of the noise filter are connected by wiring leads; however, the present invention is not limited thereto and it may be allowed that the constituent components of the noise filter are connected by conductive wires such as bus bars or lead wires.

In the scope of the present invention, the embodiments thereof can appropriately be modified or omitted.

Each of the foregoing noise filters according to respective Embodiments of the present invention is the one in which at least any one of the following inventions is put into practice.
(1) A noise filter comprising a first film condenser and a second film condenser,
  wherein the first film condenser and the second film condenser are arranged at a distance in which they are magnetically coupled with each other and are connected in parallel with each other by a first wiring lead for connecting one terminal of the first film condenser with one terminal of the second film condenser and a second wiring lead for connecting the other terminal of the first film condenser with the other terminal of the second film condenser, and
  wherein the first wiring lead and the second wiring lead are arranged in such a way as to intersect each other odd-number times.
(2) A noise filter comprising a first film condenser, a second film condenser, a first coil, and a second coil,
  wherein the first film condenser and the second film condenser are arranged at a distance in which they are magnetically coupled with each other,
  wherein there are provided a first wiring lead for connecting one terminal of the first film condenser with one terminal of the second coil and a second wiring lead for connecting the other terminal of the first film condenser with one terminal of the first coil,
  wherein one terminal of the second film condenser is connected with the other terminal of the second coil,
  wherein the other terminal of the second film condenser is connected with the other terminal of the first coil, and
  wherein the first wiring lead and the second wiring lead are arranged in such a way as to intersect each other odd-number times.
(3) The noise filter according to (2), wherein each of the first coil and the second coil is formed of a normal-mode choke coil.
(4) The noise filter according to (2), wherein the first coil and the second coil form a common-mode choke coil.
(5) A noise filter comprising three or more film condensers including a first film condenser and a second film condenser,
  wherein the first film condenser and the second film condenser are arranged at a distance in which they are magnetically coupled with each other and are connected in parallel with each other by a first wiring lead for connecting one terminal of the first film condenser with one terminal of the second film condenser and a second wiring lead for connecting the other terminal of the first film condenser with the other terminal of the second film condenser,
  wherein each of the film condensers other than the first film condenser and the second film condenser is connected in parallel with the first film condenser and the second film condenser, and
  wherein the first wiring lead and the second wiring lead are arranged in such a way as to intersect each other odd-number times.

(6) A noise filter comprising three or more film condensers including a first film condenser and a second film condenser, a first coil, and a second coil,
wherein the first film condenser and the second film condenser are arranged at a distance in which they are magnetically coupled with each other,
wherein there are provided a first wiring lead for connecting one terminal of the first film condenser with one terminal of the second coil and a second wiring lead for connecting the other terminal of the first film condenser with one terminal of the first coil,
wherein one terminal of the second film condenser is connected with the other terminal of the second coil,
wherein the other terminal of the second film condenser is connected with the other terminal of the first coil,
wherein each of the film condensers other than the first film condenser and the second film condenser is connected in parallel with the first film condenser and the second film condenser, and
wherein at least one pair of wiring leads among the first and second wiring leads and respective pairs of wiring leads for connecting the film condensers in parallel with each other intersect each other odd-number times.
(7) The noise filter according to (6), wherein each of the first coil and the second coil is formed of a normal-mode choke coil.
(8) The noise filter according to (6), wherein the first coil and the second coil form a common-mode choke coil.
(9) A noise filter comprising a first film condenser, a second film condenser, a third film condenser, a first coil, a second coil, a third coil, and a fourth coil,
wherein the first film condenser, the second film condenser, and the third film condenser are arranged at distances in which they are magnetically coupled with one another,
wherein there are provided a first wiring lead for connecting one terminal of the first film condenser with one terminal of the first coil, a second wiring lead for connecting the other terminal of the first film condenser with one terminal of the second coil, a third wiring lead for connecting one terminal of the third film condenser with the other terminal of the first coil, a fourth wiring lead for connecting the other terminal of the third film condenser with the other terminal of the second coil, a fifth wiring lead for connecting one terminal of the third film condenser with one terminal of the third coil, a sixth wiring lead for connecting the other terminal of the third film condenser with one terminal of the fourth coil, a seventh wiring lead for connecting one terminal of the second film condenser with the other terminal of the third coil, and an eighth wiring lead for connecting the other terminal of the second film condenser with the other terminal of the fourth coil, and
wherein in at least one of the respective wiring pairs between the first wiring lead and the second wiring lead, the third wiring lead and the fourth wiring lead, the fifth wiring lead and the sixth wiring lead, and the seventh wiring lead and the eighth wiring lead, the wiring leads intersect each other odd-number times.
(10) The noise filter according to (9), wherein each of the first coil, the second coil, the third coil, and the fourth coil is formed of a normal-mode choke coil.
(11) The noise filter according to (9), wherein each of the respective pairs between the first coil and the second coil and between the third coil and the fourth coil forms a common-mode choke coil.
(12) The noise filter according to (2), wherein the one and the other terminals of the first film condenser are connected to a power source, and
wherein the one and the other terminals of the second film condenser are connected to an electric apparatus.
(13) The noise filter according to (2), wherein the one and the other terminals of the first film condenser are connected to an electric apparatus, and
wherein the one and the other terminals of the second film condenser are connected to a power source.
(14) The noise filter according to (2), wherein the one and the other terminals of the first film condenser are connected to an electric apparatus, and
wherein the one and the other terminals of the second film condenser are connected to a load of an electric apparatus.
(15) The noise filter according to (2), wherein the one and the other terminals of the first film condenser are connected to a load of an electric apparatus, and
wherein the one and the other terminals of the second film condenser are connected to an electric apparatus.
(16) The noise filter according to (1), wherein the filter circuit is mounted on a circuit board, and
wherein at least the first and second wiring leads are each formed of a circuit-board strip conductor.
(17) The noise filter according to (1), wherein at least the first and second wiring leads are each formed of a bus bar.
(18) The noise filter according to (1), wherein at least the first and second wiring leads are each formed of a conductive wire such as a lead wire.

INDUSTRIAL APPLICABILITY

The present invention can be utilized in the field of an electric apparatus such as an AC/DC converter or an inverter or in the field of a vehicle such as an automobile in which the foregoing electric apparatus is mounted.

DESCRIPTION OF REFERENCE NUMERALS

C1: 1st across-the-line condenser (1st X condenser)
C1: 2nd across-the-line condenser (2nd X condenser)
C3: 3rd across-the-line condenser (3rd X condenser)
L1: 1st coil
L2: 2nd coil
V1: noise source

The invention claimed is:
1. A noise filter comprising:
a first film condenser; and
a second film condenser,
wherein the first film condenser and the second film condenser are arranged at a distance in which the first film condenser and the second film condenser are magnetically coupled with each other of an inductive nature and are connected in parallel with each other by a first wiring lead, which connects a first terminal of the first film condenser directly with a first terminal of the second film condenser, and by a second wiring lead, which connects a second terminal of the first film condenser directly with a second terminal of the second film condenser, without any other circuit component connected between the first film condenser and the second film condenser, and
wherein the first wiring lead and the second wiring lead are arranged in such a way as to intersect each other an odd number of times.
2. The noise filter according to claim 1, wherein each of the first and second wiring leads is formed of a bus bar.
3. The noise filter according to claim 1, wherein each of the first and second wiring leads is formed of a conductive wire.

4. A noise filter comprising:

three or more film condensers including a first film condenser and a second film condenser, wherein the first film condenser and the second film condenser are arranged at a distance in which the first film condenser and the second film condenser are magnetically coupled with each other of an inductive nature and are connected in parallel with each other by a first wiring lead, which connects a first terminal of the first film condenser directly with a first terminal of the second film condenser, and by a second wiring lead, which connects a second terminal of the first film condenser directly with a second terminal of the second film condenser, without any other circuit component connected between the first film condenser and the second film condenser, wherein each of the three or more film condensers other than the first film condenser and the second film condenser is connected in parallel with the first film condenser and the second film condenser, and wherein the first wiring lead and the second wiring lead are arranged in such a way as to intersect each other an odd number of times.

5. The noise filter according to claim 4, wherein the first and second terminals of the first film condenser are connected to a power source, and wherein the first and second terminals of the second film condenser are connected to an electric apparatus.

6. The noise filter according to claim 4, wherein the first and second terminals of the first film condenser are connected to an electric apparatus, and wherein the first and second terminals of the second film condenser are connected to a power source.

7. The noise filter according to claim 4, wherein the first and second terminals of the first film condenser are connected to an electric apparatus, and wherein the first and second terminals of the second film condenser are connected to a load of an electric apparatus.

8. The noise filter according to claim 4, wherein the first and second terminals of the first film condenser are connected to a load of an electric apparatus, and wherein the first and second terminals of the second film condenser are connected to an electric apparatus.

\* \* \* \* \*